(12) United States Patent
Narayanun et al.

(10) Patent No.: US 10,663,515 B2
(45) Date of Patent: May 26, 2020

(54) METHOD AND APPARATUS TO ACCESS HIGH VOLUME TEST DATA OVER HIGH SPEED INTERFACES

(71) Applicant: NVIDIA Corp., Santa Clara, CA (US)

(72) Inventors: Kaushik Narayanun, San Jose, CA (US); Shantanu Sarangi, Saratoga, CA (US)

(73) Assignee: NVIDIA Corp., Santa Clara, CA (US)

( * ) Notice: Subject to any disclaimer, the term of this patent is extended or adjusted under 35 U.S.C. 154(b) by 0 days.

(21) Appl. No.: 16/175,423

(22) Filed: Oct. 30, 2018

(65) Prior Publication Data

US 2019/0128964 A1 May 2, 2019

Related U.S. Application Data

(60) Provisional application No. 62/580,265, filed on Nov. 1, 2017.

(51) Int. Cl.
*G01R 31/28* (2006.01)
*G01R 31/3185* (2006.01)
*G06F 13/42* (2006.01)
*G06T 1/20* (2006.01)
*G11C 29/00* (2006.01)

(52) U.S. Cl.
CPC . *G01R 31/318597* (2013.01); *G06F 13/4282* (2013.01); *G06T 1/20* (2013.01); *G11C 29/00* (2013.01); *G06F 2213/0026* (2013.01); *G06F 2213/0042* (2013.01)

(58) Field of Classification Search
CPC ......... G01R 31/318597; G06F 13/4282; G06F 2213/0042; G06F 2213/0026; G06T 1/20; G11C 29/00
See application file for complete search history.

(56) References Cited

U.S. PATENT DOCUMENTS

| | | |
|---|---|---|
| 6,493,647 B1 | 12/2002 | Chiang et al. |
| 6,550,033 B1 | 4/2003 | Dwork |
| 6,615,378 B1 | 9/2003 | Dwork |
| 6,675,335 B1 | 1/2004 | Chiang et al. |
| 7,926,012 B1 * | 4/2011 | Parimi .................. G06F 17/505 324/76.66 |
| 2005/0015671 A1 | 1/2005 | Parulkar et al. |
| 2005/0204232 A1 | 9/2005 | Seuring |
| 2009/0300440 A1 | 12/2009 | Andreev et al. |
| 2016/0365157 A1 * | 12/2016 | Sang ..................... G11C 29/40 |

* cited by examiner

*Primary Examiner* — Samir W Rizk
(74) *Attorney, Agent, or Firm* — Rowan TELS LLC

(57) ABSTRACT

A hardware controller of a device under test (DUT) communicates with a PCIe controller to fetch test data and control test execution. The hardware controller also communicates with a JTAG/IEEE 1500 component to set up the DUT into various test configurations and to trigger test execution. For SCAN tests, the hardware controller provides a high throughput direct access to the on-chip compressors/decompressors to load the scan data and to collect the test results.

19 Claims, 6 Drawing Sheets

METHOD AND APPARATUS TO ACCESS HIGH VOLUME TEST DATA OVER HIGH SPEED INTERFACES

CROSS REFERENCE TO RELATED APPLICATIONS

This application claims the benefit of U.S. provisional patent application Ser. No. 62/580,265, filed on Nov. 1, 2017, the contents of which are incorporated herein by reference in their entirety.

BACKGROUND

Industry practices for testing systems-on-a-chip (SOCs) require expensive automated test equipment (ATE) whose cost is directly proportional to the number of channels, speed, and operational memory available per test input-output (TO) channel. As chip sizes grow, requirements increase for memory per IO channel.

In many cases, additional test IO channels are not available nor does the speed of test channels improve. With 2.5D and 3D chips becoming more prevalent the IO channels available for test have further decreased. Scan compression schemes from various electronic design automation (EDA) tool vendors aim to achieve lower test data requirements, but they come at the cost of poor test coverage or vendor-specific design customization.

Correlating ATE to system-level test failures is another challenge. Executing structural tests at system level is expensive, which often makes this process impractical. There have been some efforts to enable structural test at system-level but these utilize special-purpose test interfaces and are not broadly applicable. Existing solutions tend to incur high latency making them expensive to use with multiple fault models or test programs.

Automotive and high-performance computing (HPC) applications require tests to execute in the field to help ensure safety and reliability. Structural tests provide high test coverage compared to functional patterns and are most suited to satisfy the requirements of these applications. Existing schemes for in-field structural testing are limited by long execution times and/or data storage requirements.

BRIEF SUMMARY

Embodiments of a system are disclosed that ameliorate the challenges of earlier approaches. High throughput testing is enabled on existing IO channel circuits utilizing the IO channels in their functional mode. Earlier approaches rely on special-purpose test circuitry in the IO channels the cost of which increases with the throughput requirements of the test.

The role of the ATE is simplified to providing power and thermal control. Earlier approaches utilize the ATE to provide the test data as well as to evaluate the test results. The disclosed embodiments enable smaller and less expensive ATEs.

The disclosed embodiments are applicable to platforms including ATE, system-level test (SLT), board, and in-field testing. This portability enables diagnosis and debug correlation between platforms. Earlier approaches have specific design features for each platform making correlation challenging.

The disclosed embodiments may be utilized to test automotive ISO spec compliance for fault tolerant time interval (FTTI) and improve the reliability of HPC products.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

"FTTI" refers to fault tolerant time interval. The ISO 26262 standard defines FTTI as, a time-span in which a fault (1.42) or faults can be present in a system (1.129) before a hazardous (1.57) event occurs.

"IEEE 1500" refers to a scalable standard architecture for enabling test reuse and integration for embedded cores and associated circuitry. It foregoes addressing analog circuits and focuses on facilitating efficient test of digital aspects of systems on chip (SoCs). IEEE Std 1500 has serial and parallel test access mechanisms (TAMs) and a rich set of instructions suitable for testing cores, SoC interconnect, and circuitry. In addition, IEEE Std 1500 defines features that enable core isolation and protection.

"ISO 26262" refers to an international standard for functional safety of electrical and/or electronic systems in production automobiles defined by the International Organization for Standardization (ISO).

"MBIST" refers to Memory Built-In Self-Test, logic that generates a set of March Algorithms that may be applied to detect memory faults.

"PCIe" refers to Peripheral Component Interconnect Express, a high-speed serial computer expansion bus standard, designed to replace the older PCI, PCI-X, and AGP bus standards. PCIe has numerous improvements over the older standards, including higher maximum system bus throughput, lower I/O pin count and smaller physical footprint, better performance scaling for bus devices, a more detailed error detection and reporting mechanism (Advanced Error Reporting, AER), and native hot-plug functionality. More recent PCIe standard devices provide hardware support for I/O virtualization.

Embodiments of a system are disclosed enabling high-speed IO (e.g., PCIe, USB 2.0 and above, IEEE 1394/1394b, Serial ATA, NVLink™, etc.) based testing of systems-on-a-chip (SOCs) at wafer- and system-levels. The requirement for expensive test equipment is ameliorated by reducing the IO channel and memory per IO channel requirements of conventional approaches. The ATE architecture and design may thus be simplified to enable smaller form factors and reduce capital costs of ownership and maintenance. Test insertion complexities may also be reduced by directly testing the SOCs on system-level platforms.

The system is based on existing high-speed input output (HSIO), e.g. PCIe, standards, making it portable across platforms including ATE, system-level test (SLT), board, and in-field test. The high throughput enables in-field testing within fault tolerant time interval (FTTI) for ISO 26262 compliance.

Figure 1:
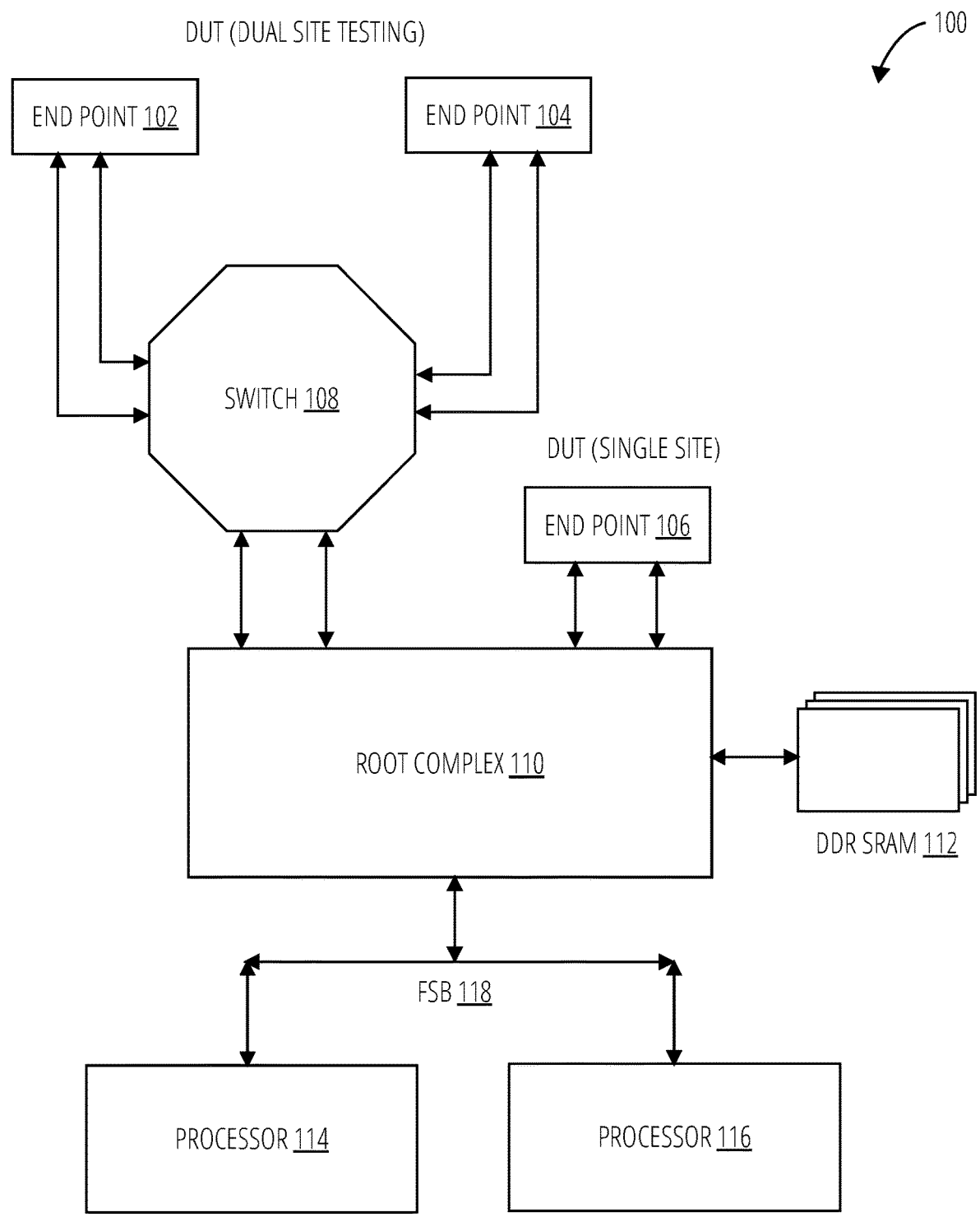
FIG. 1 illustrates a system architecture 100 in accordance with one embodiment.

FIG. 1 illustrates a system architecture 100 in accordance with one embodiment. The system architecture 100 comprises an end point 102, an end point 104, an end point 106, a switch 108, a root complex 110, a DDR SRAM 112, a processor 114, a processor 116, and a front-side bus 118. The root complex 110 mediates communication by peripheral devices ("endpoints") on the front-side bus 118. A well-known example of a root complex 110 is a southbridge.

Figure 3:
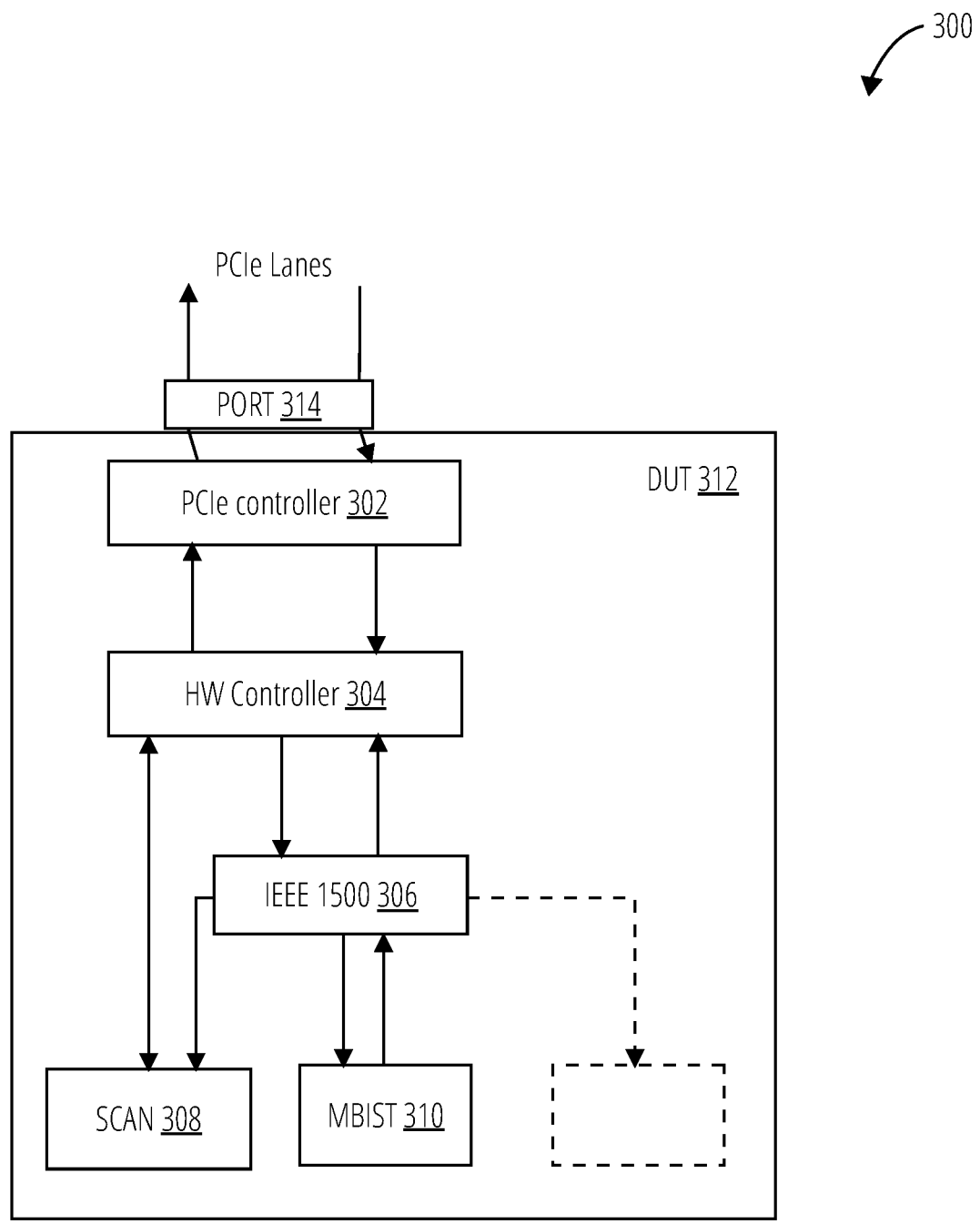
FIG. 3 illustrates DUT logic components 300 in accordance with one embodiment.

The system architecture 100 is scalable to different platforms. A device-under-test (DUT) is added for example as a PCIe end point 106 or, for dual site testing, as the end point 102 and end point 104 coupled via switch 108 in this example. Test data and test results are stored by the system memory (e.g., DDR SRAM 112) which is accessible to the CPU (e.g., processor 114 and processor 116 via front-side bus 118 to the root complex 110). The CPU manages the overall test process, loads system memory with test data, and triggers each DUT for "Self-Test". FIG. 3 illustrates a controller that may be implemented within the DUT.

The system architecture 100 masters the front-side bus 118 and performs direct memory access (DMA) for test data, executes tests, stores responses in the system memory, and triggers the CPU when testing is done. The CPU compares test responses with expected results to confirm Pass/Fail status.

Multiple devices may be tested serially or concurrently by the system architecture 100. Swapping devices manifests as a hot plug event, and the devices undergo enumeration to become visible to the CPU on the bus, after which the above process may be executed.

Figure 2:
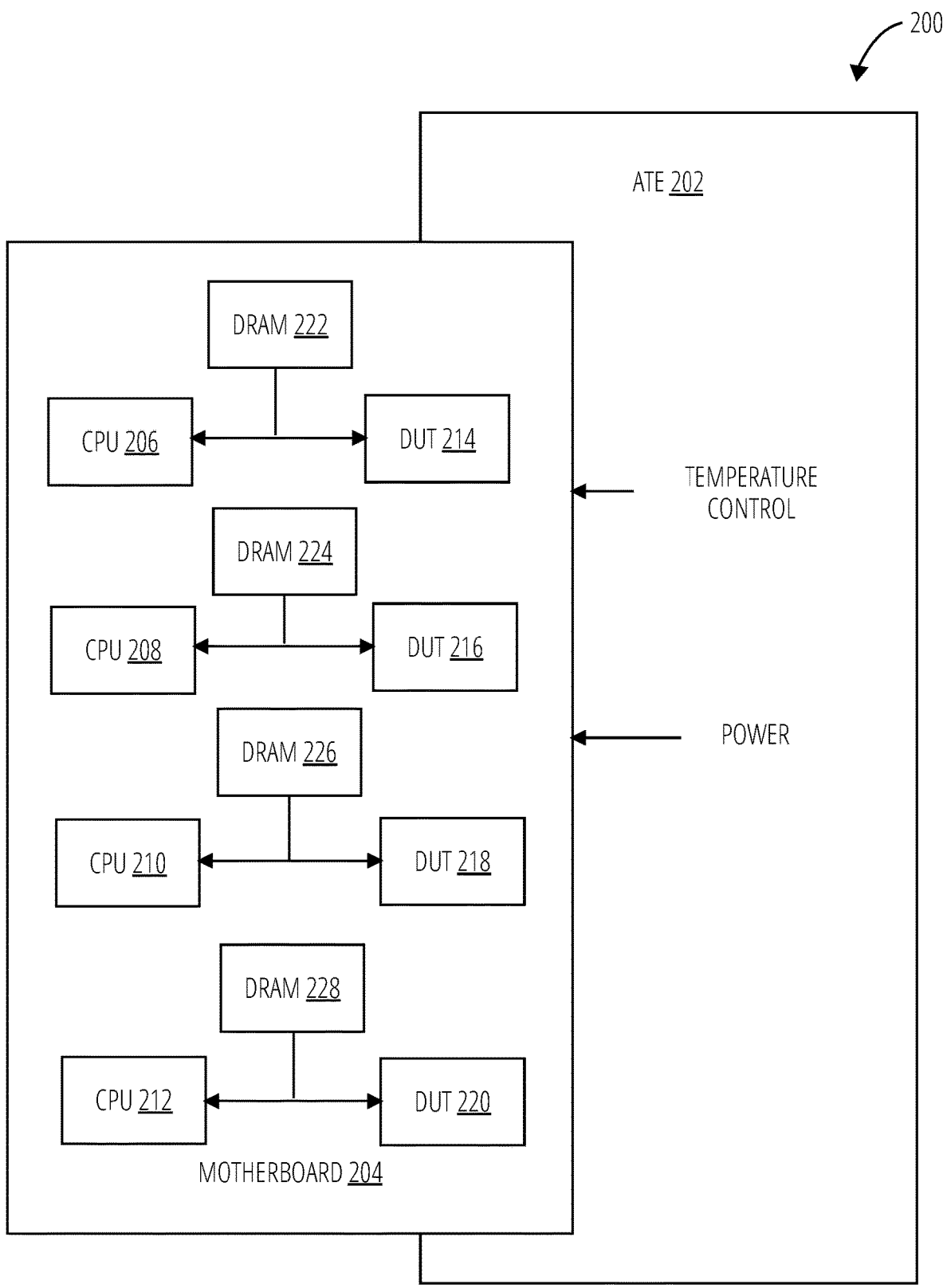
FIG. 2 illustrates an ATE architecture 200 in accordance with one embodiment.

FIG. 2 illustrates an ATE architecture 200 in accordance with one embodiment. The ATE architecture 200 comprises an automated test equipment 202, an automated test equipment 204, a CPU 206, a CPU 208, a CPU 210, a CPU 212, a DUT 214, a DUT 216, a DUT 218, a DUT 220, a DRAM 222, a DRAM 224, a DRAM 226, and a DRAM 228.

FIG. 2 illustrates exemplary ATE use cases for the system architecture 100. The automated test equipment 204 has multiple physical or virtualized CPUs with dedicated system memory (e.g., DRAMs), together driving the DUTs. In this scheme the role of the automated test equipment 202 is simplified to providing power and temperature control. Testing and result comparison are executed by the CPU <-> DUT's controller (see FIG. 3), in conjunction with logic executing on the CPU.

FIG. 3 illustrates DUT logic components 300 in accordance with one embodiment. The DUT logic components 300 include a bus controller 302, a hardware controller 304, an IEEE 1500 306 component, a scan chain 308, and an MBIST 310 component.

The hardware controller 304 of the DUT 312 communicates with the bus controller 302 to fetch the test data and control the test execution. The hardware controller 304 also communicates with the JTAG/IEEE 1500 306 component to set the DUT 312 into various test configurations and to trigger the tests. For scan chain 308 tests, the hardware controller 304 provides a high throughput direct access to the on-chip compressors/decompressors to load the scan data and to collect the data back from compressors.

Figure 4:
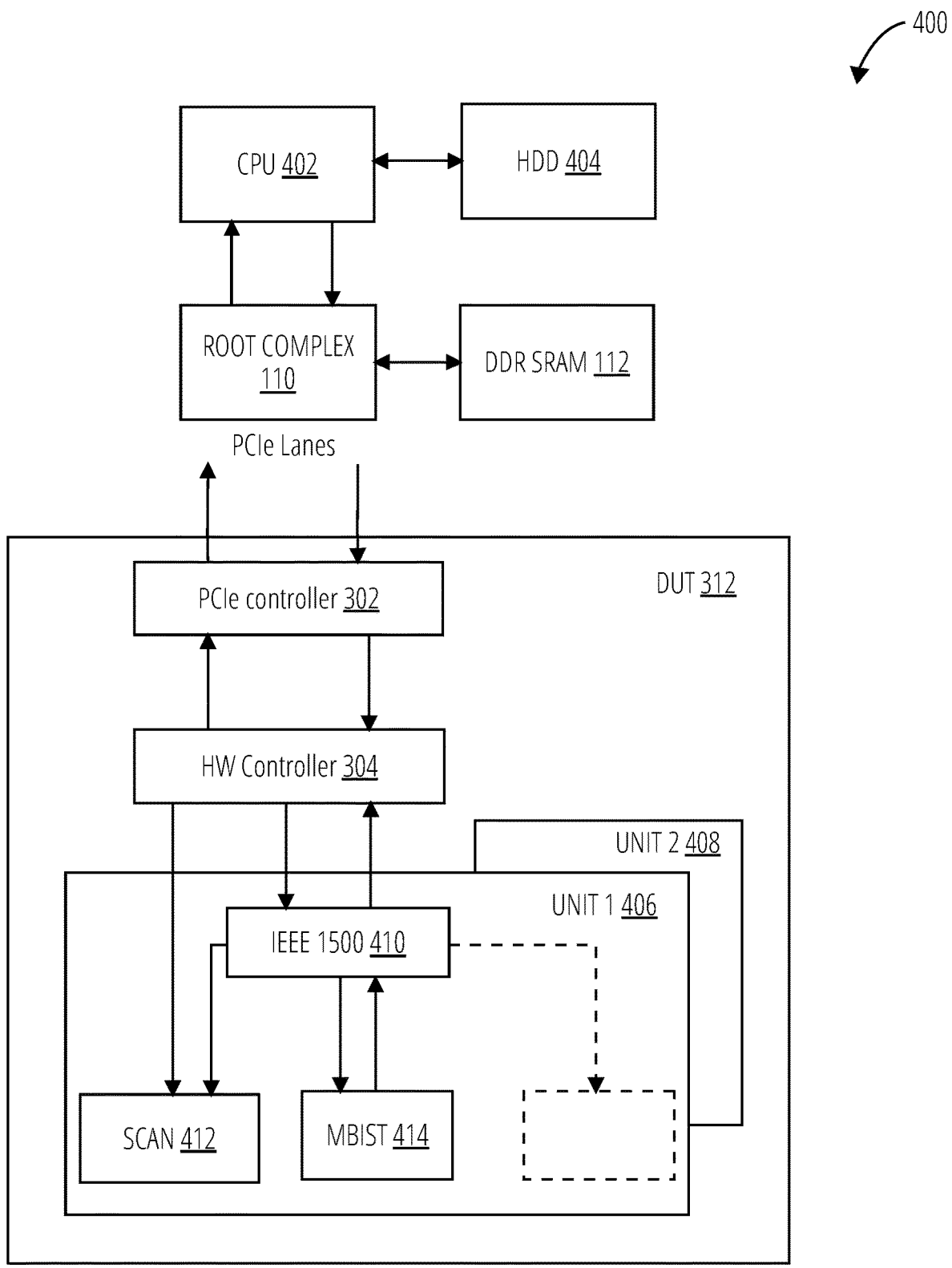
FIG. 4 illustrates a test system 400 in accordance with one embodiment.
Figure 5:
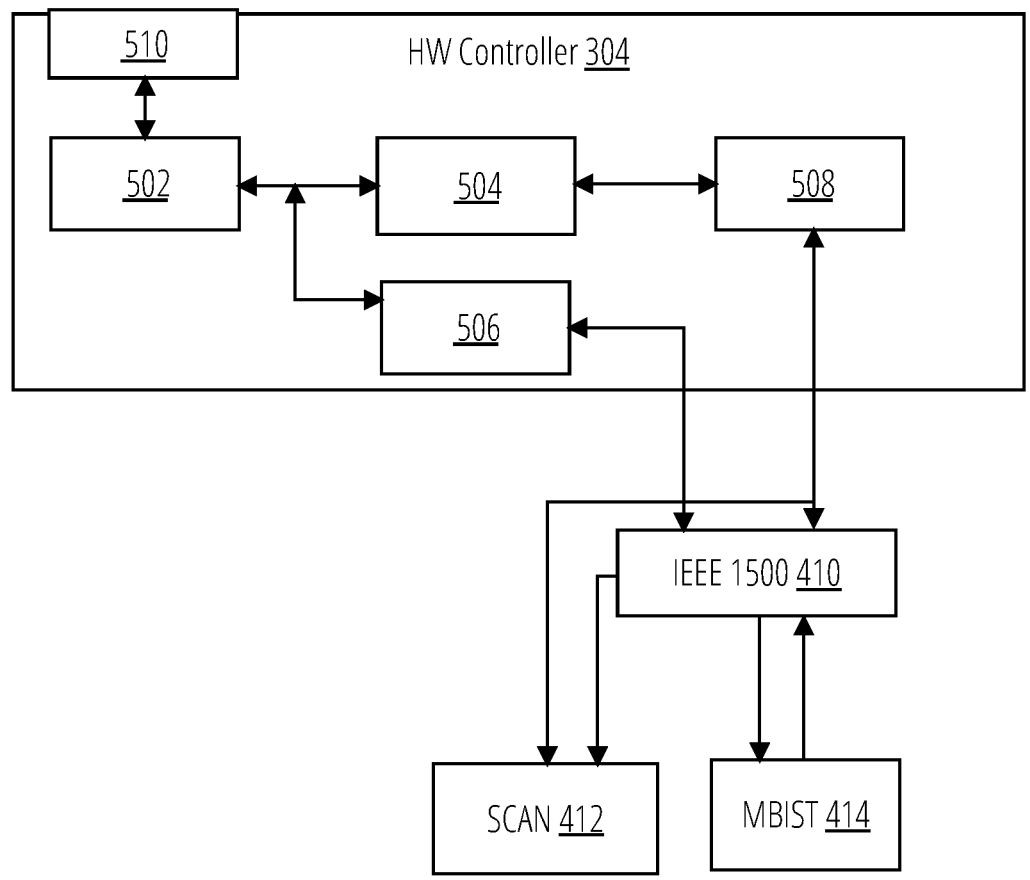
FIG. 5 illustrates a hardware controller 304 in accordance with one embodiment.

FIG. 4 illustrates a test system 400 in accordance with one embodiment. The test system 400 comprises a CPU 402, an HDD 404, a root complex 110, a DDR SRAM 112, and a DUT 312. The DUT 312 comprises a bus controller 302, a hardware controller 304, a unit 1 406, and a unit 2 408. The unit 1 406 comprises a JTAG/IEEE 1500 component 410, a scan chains 412 component, and an MBIST component 414. The unit 2 408 would typically comprise similar components.

Depending on the idleness of the unit 1 406 inside the DUT 312, the DUT 312 communicates to the CPU to test the unit 1 406 with other units (e.g., unit 2 408) remaining functional. The functional state of unit 1 406 may be stored in on-chip memory or in the system memory (e.g., DDR SRAM 112). The CPU loads test data into the system memory from the hard disk drive (e.g., HDD 404). The CPU prepares the DUT 312 for test by executing the logic for set up, and triggers the hardware controller (e.g., hardware controller 304) to test the specific unit of the DUT 312. After the test execution the CPU restores the functional state of the unit that was tested and indicates to the DUT 312 to resume operation.

A single CPU 402 may thus be used to test DUTs of a complex electronic system or circuit board. Each DUT 312 includes a bus controller 302 interfacing to an external bus port 314 and an internalized hardware controller 304 coupled to the bus controller 302. The hardware controller 304 controls and coordinates a scan chain 308 and MBIST 310 component internalized in each functional unit in the DUT. "Internalized" means that the scan chain 308 and MBIST 310 are not ported to the pins on the periphery of the containing functional unit, and the hardware controller 304 is likewise internal to the containing DUT (the hardware controller 304 interacts with external devices of the DUT via the external bus port 314). A DUT 312 may in some cases comprise only a single functional unit, in which case the functional unit and the DUT 312 may be one and the same. Typically, each DUT contains multiple functional units, each comprising a local (internalized to the DUT) scan chain, a local IEEE 1500 component, and (optionally) an MBIST component (if the functional unit has a memory array or contributes to the test of an external memory array. The operation of each of these local devices is coordinated by a hardware controller 304 central to all the functional units in the DUT.

The hardware controller 304 includes logic to independently coordinate operation of the internalized components of the functional units according to test logic received via the bus controller. The system architecture 100 is designed to be flexible in terms of where the memory array or portion thereof to be tested by a particular MBIST 310 is implemented in the design. For example the memory array tested by a particular MBIST 310 may be internal to the functional unit comprising the MBIST 310, or the memory array may be internal to the DUT comprising the MBIST 310 but shared by the functional units of the DUT, or the root complex 110 may couple one or more of the DUTs to a shared memory array. Thus the MBIST of a particular functional unit or DUT may utilize a memory bus to a local memory array or non-local memory array, depending on the implementation. However, a particular MBIST is internalized to a particular functional unit in terms of its test inputs and controls and return of test results. These architectural features may enable a large reduction in a number of IO test channel pins on complex electronic devices, including enabling the testing of large shared memory arrays in a distributed fashion across many functional units and DUTs.

The hardware controller 304 in one embodiment comprises an in-system test sequencer 502, an LBIST master controller 504, a JTAG controller 506, an LBIST scan chain controller 508, and a PCIe controller 510. The PCIe controller 510 is operated to fetch test data from system memory and to write test results to system memory. The LBIST master controller 504 communicates with the in-system test sequencer 502 and the LBIST scan chain controller 508, which drives the scan chains 412. The in-system test sequencer 502 communicates read/write data, address, and length of data to the LBIST master controller 504 and raises DMA read/write requests for data. Read completion data is received and decoded by the in-system test sequencer 502 and sent either to the LBIST master controller 504 or the JTAG controller 506. The LBIST scan chain controller 508 drives the decompression/compression structures of the scan chains 412 to transfer the scan data into the scan chains and collect the data back from the test result shift registers. The JTAG controller 506 taps into the IEEE 1500 component 410 network to program the IEEE 1500 registers. This is merely one example of how the hardware controller 304 may be implemented.

Figure 6:
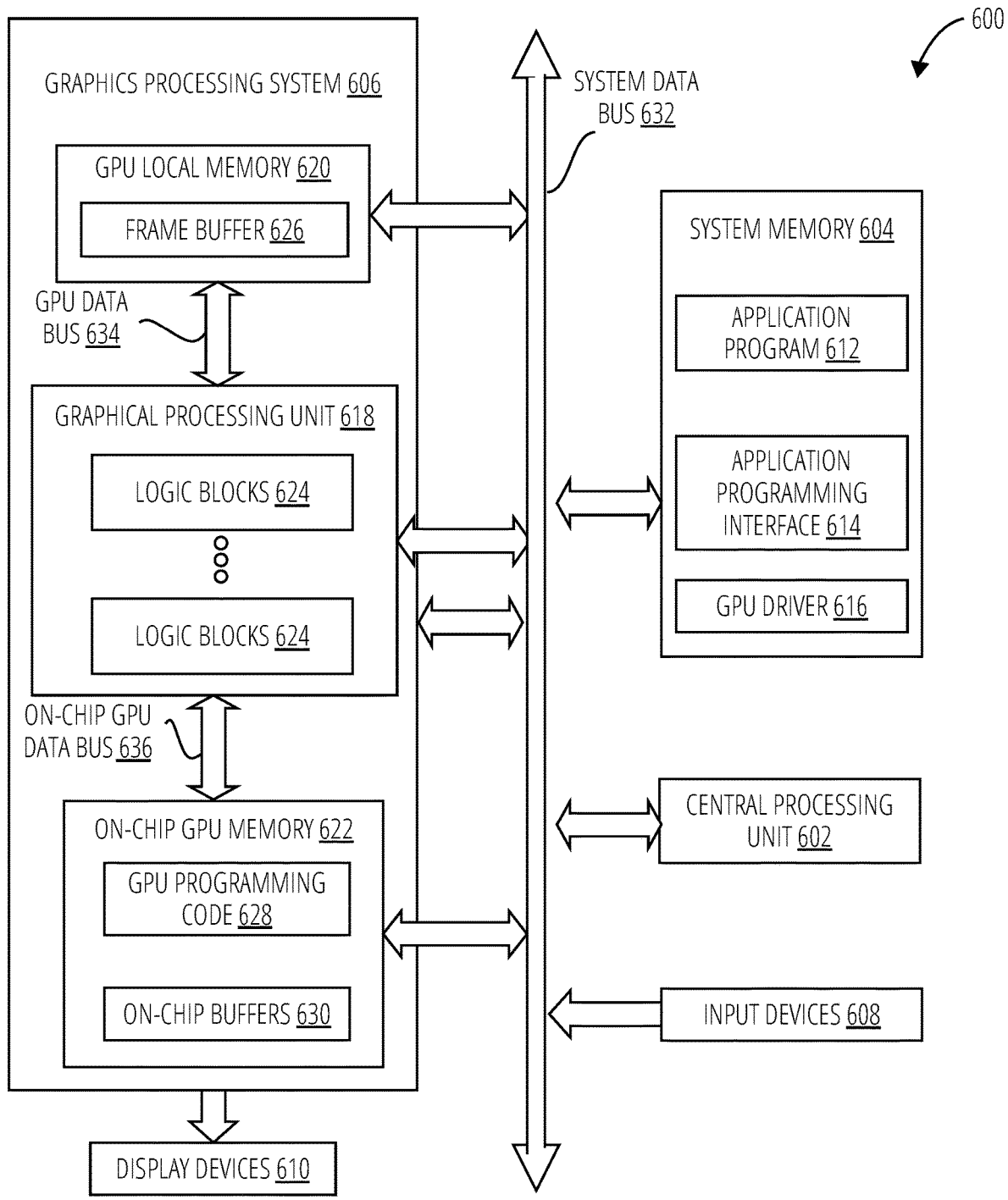
FIG. 6 is a block diagram of a computing system 600 within which the techniques introduced herein may be embodied or carried out.

FIG. 6 is a block diagram of one embodiment of a computing system 600 in which one or more aspects of the disclosure may be implemented. The computing system 600 includes a system data bus 632, a CPU 602, input devices 608, a system memory 604, a graphics processing system 606, and display devices 610. In alternate embodiments, the CPU 602, portions of the graphics processing system 606, the system data bus 632, or any combination thereof, may be integrated into a single processing unit. Further, the functionality of the graphics processing system 606 may be included in a chipset or in some other type of special purpose processing unit or co-processor.

As shown, the system data bus 632 connects the CPU 602, the input devices 608, the system memory 604, and the graphics processing system 606. In alternate embodiments, the system memory 604 may connect directly to the CPU 602. The CPU 602 receives user input from the input devices 608, executes programming instructions stored in the system memory 604, operates on data stored in the system memory 604 to perform computational tasks. The system memory 604 typically includes dynamic random access memory (DRAM) employed to store programming instructions and data. The graphics processing system 606 receives instructions transmitted by the CPU 602 and processes the instructions, for example to implement aspects of the disclosed embodiments, and/or to render and display graphics (e.g., images, tiles, video) on the display devices 610.

As also shown, the system memory 604 includes an application program 612, an API 614 (application programming interface), and a graphics processing unit driver 616 (GPU driver). The application program 612 generates calls to the API 614 to produce a desired set of computational results. For example, the application program 612 may transmit programs or functions thereof to the API 614 for processing within the graphics processing unit driver 616.

The graphics processing system 606 includes a GPU 618 (graphics processing unit), an on-chip GPU memory 622, an on-chip GPU data bus 636, a GPU local memory 620, and a GPU data bus 634. The GPU 618 is configured to communicate with the on-chip GPU memory 622 via the on-chip GPU data bus 636 and with the GPU local memory 620 via the GPU data bus 634. The GPU 618 may receive instructions transmitted by the CPU 602, process the instructions, and store results in the GPU local memory 620. Subsequently, the GPU 618 may display certain graphics stored in the GPU local memory 620 on the display devices 610. The test architectures disclosed herein may be utilized within the graphics processing system 606 to test the GPU 618, the GPU local memory 620 and the on-chip GPU memory 622, wherein those components may be in common or different functional test partitions. The CPU 602 may be utilized for the test patterns and to coordinate the hardware controller 304 of each functional partition, and to store test results in the system memory 604 for analysis.

The GPU 618 includes one or more logic blocks 624. The logic blocks 624 may implement embodiments of the systems and techniques disclosed herein, such as test logic of the hardware controller 304.

The GPU 618 may be provided with any amount of on-chip GPU memory 622 and GPU local memory 620, including none, and may employ on-chip GPU memory 622, GPU local memory 620, and system memory 604 in any combination for memory operations.

The on-chip GPU memory 622 is configured to include GPU programming 628 and on-Chip Buffers 630. The GPU programming 628 may be transmitted from the graphics processing unit driver 616 to the on-chip GPU memory 622 via the system data bus 632. The GPU programming 628 may include the logic blocks 624.

The GPU local memory 620 typically includes less expensive off-chip dynamic random access memory (DRAM) and is also employed to store data and programming employed by the GPU 618. As shown, the GPU local memory 620 includes a frame buffer 626. The frame buffer 626 may store data such as an image, e.g., a graphics surface, that may be employed to drive the display devices 610. The frame buffer 626 may include more than one surface so that the GPU 618 can render one surface while a second surface is employed to drive the display devices 610.

The display devices 610 are one or more output devices capable of emitting a visual image corresponding to an input data signal. For example, a display device may be built using a liquid crystal display, or any other suitable display system. The input data signals to the display devices 610 are typically generated by scanning out the contents of one or more frames of image data that is stored in the frame buffer 626.

What is claimed is:

1. An apparatus comprising:
   an external bus port;
   a memory;
   a hardware controller;
   logic to buffer test data and test controls obtained via the bus port in the memory; and
   a plurality of functional units each comprising:
      an internalized scan chain;
      an internalized IEEE 1500 component;
      an internalized MBIST component; and
   the hardware controller comprising logic to, for each of the functional units, use direct memory access to the memory over the external bus port to obtain the test data and test controls to independently coordinate operation of the internalized IEEE 1500 component on the scan chain, and the internalized MBIST component on a memory array.

2. The apparatus of claim 1, the memory array tested by a particular MBIST component being internal to a functional unit comprising the particular MBIST component.

3. The apparatus of claim 1, the memory array tested by a plurality of MBIST components in different functional units.

4. The apparatus of claim 1, the hardware controller comprising a test sequencer to provide the direct memory access over a PCI bus.

5. The apparatus of claim 1, the internalized IEEE 1500 component interfacing to the internalized scan chain via JTAG.

6. The apparatus of claim 1, the memory array external to the functional device.

7. The apparatus of claim 1, the apparatus comprising a graphics processing unit.

8. The apparatus of claim 1, the external bus port comprising a Peripheral Component Interconnect type E (PCIe) port.

9. The apparatus of claim 1, the external bus port comprising a Universal Serial Bus (USB) port.

10. The apparatus of claim 1, configured such that during testing of the apparatus using automatic test equipment, use of the external bus port is limited to temperature control and power.

11. A system comprising:
an interface to external automatic test equipment;
a central processing unit;
a system memory; and
a plurality of devices each comprising:
 a hardware controller;
 logic to store test data and test controls to the system memory; and
 a plurality of functional units each comprising:
  an internalized scan chain;
  an internalized IEEE 1500 component;
  an internalized MBIST component; and
 the hardware controller comprising logic to independently coordinate operation of the internalized IEEE 1500 component on the scan chain, and the internalized MBIST component on a memory array; and
the hardware controller controlled by the central processing unit independently of the automatic test equipment, such that test data is obtained from the system memory via direct memory access during testing and controls provided over the interface to the automatic test equipment during testing are limited to temperature controls.

12. The apparatus of claim 11, the memory array tested by a particular MBIST component being internal to a functional unit comprising the particular MBIST component.

13. The apparatus of claim 11, the memory array tested by a plurality of MBIST components in different functional units.

14. The apparatus of claim 11, the hardware controller comprising a test sequencer to provide the direct memory access over a PCI bus, an LBIST master controller, a JTAG controller, and an LBIST scan chain controller.

15. The apparatus of claim 11, the internalized IEEE 1500 component interfacing to the internalized scan chain via JTAG.

16. The apparatus of claim 11, the memory array external to the functional device.

17. The apparatus of claim 11, the apparatus comprising a graphics processing unit.

18. The apparatus of claim 11, the external bus port comprising a Peripheral Component Interconnect type E (PCIe) port.

19. The apparatus of claim 11, the external bus port comprising a Universal Serial Bus (USB) port.

\* \* \* \* \*